US010012976B2

(12) United States Patent
Louesdon et al.

(10) Patent No.: US 10,012,976 B2
(45) Date of Patent: Jul. 3, 2018

(54) METHOD FOR MACHINING THE TRAILING EDGE OF A TURBINE ENGINE BLADE

(71) Applicant: SNECMA, Paris (FR)

(72) Inventors: Yvon Marie-Joseph Louesdon, Taverny (FR); Florian Le Merdi, Paris (FR); Joseph Tami, Gonesse (FR); Daniel Quach, Fontenay Sous Bois (FR); Fadoua Cisse, Argenteuil (FR); Sabine Maltaverne, Acheres (FR); Damien Alquier, Paris (FR)

(73) Assignee: SNECMA, Paris (FR)

( * ) Notice: Subject to any disclaimer, the term of this patent is extended or adjusted under 35 U.S.C. 154(b) by 362 days.

(21) Appl. No.: 14/395,645

(22) PCT Filed: Apr. 22, 2013

(86) PCT No.: PCT/FR2013/050891
§ 371 (c)(1),
(2) Date: Oct. 20, 2014

(87) PCT Pub. No.: WO2013/160601
PCT Pub. Date: Oct. 31, 2013

(65) Prior Publication Data
US 2015/0081074 A1 Mar. 19, 2015

(30) Foreign Application Priority Data
Apr. 24, 2012 (FR) ...................... 12 53764

(51) Int. Cl.
*G05B 19/4097* (2006.01)
*G05B 19/4099* (2006.01)
(Continued)

(52) U.S. Cl.
CPC ............ *G05B 19/4097* (2013.01); *B23C 3/18* (2013.01); *G05B 19/4099* (2013.01);
(Continued)

(58) Field of Classification Search
CPC ............ G05B 19/4097; G05B 19/4099; G05B 2219/35082; G05B 2219/35128;
(Continued)

(56) References Cited

U.S. PATENT DOCUMENTS 2,681,500 A * 6/1954 Whitehead .............. B23P 15/02
29/889.7
3,099,777 A * 7/1963 Davis ................... G05B 19/231
318/162

(Continued)

FOREIGN PATENT DOCUMENTS

FR          2 913 901          9/2008

OTHER PUBLICATIONS

Machine translation of EP0396438, Canourgues Alain, Method of automatic determination of toolpath in a plane machining of zones, Nov. 7, 1990, 11 pages.*

(Continued)

*Primary Examiner* — Thomas C Lee
*Assistant Examiner* — Tri T Nguyen
(74) *Attorney, Agent, or Firm* — Oblon, McClelland, Maier & Neustadt, L.L.P.

(57) ABSTRACT

A method for manufacturing a turbine engine blade including an airfoil with a profile defined by a theoretical digital model, the method including: manufacturing a blank having a thickened portion along a trailing edge of the airfoil relative to the theoretical profile; removing the thickened portion by adaptive machining, including: positioning the blank in a reference frame; acquiring, by probing at a predetermined number of points on a first surface of the blank along the trailing edge, positions of the points in the reference frame; determining differences, in one direction, in position from corresponding points of the theoretical model; producing machining grids on the blank surface, peaks of the grids determined from the points; determining an amount of material to be removed from the surface of the grids, based (Continued)

on the position of the points relative to the peaks and the deviations in position; and machining the airfoil.

14 Claims, 3 Drawing Sheets

(51) Int. Cl.
 *B23C 3/18* (2006.01)
 *G06F 17/50* (2006.01)
(52) U.S. Cl.
 CPC .......... *G06F 17/50* (2013.01); *B23C 2215/44* (2013.01); *G05B 2219/35082* (2013.01); *G05B 2219/35128* (2013.01); *G05B 2219/37355* (2013.01); *G05B 2219/45147* (2013.01)
(58) Field of Classification Search
 CPC .......... G05B 2219/37355; G05B 2219/45147; B23C 3/18; B23C 2215/44; G06F 17/50
 See application file for complete search history.

(56) References Cited

U.S. PATENT DOCUMENTS

| | | | | |
|---|---|---|---|---|
| 3,639,992 A | * | 2/1972 | Dabrush | B23P 6/002 33/553 |
| 5,055,752 A | * | 10/1991 | Leistensnider | B23C 3/18 318/570 |
| 5,146,670 A | * | 9/1992 | Jones | G05B 19/4097 144/135.2 |
| 5,288,209 A | | 2/1994 | Therrien et al. | |
| 8,297,934 B2 | * | 10/2012 | Lutz | F01D 5/14 415/200 |
| 2007/0234564 A1 | | 10/2007 | Shafir | |
| 2009/0041586 A1 | * | 2/2009 | Bacha | F01D 5/187 416/97 R |
| 2009/0088890 A1 | * | 4/2009 | Glaesser | G05B 19/4083 700/160 |
| 2009/0144980 A1 | * | 6/2009 | Rangarajan | B23P 6/007 29/889.1 |
| 2010/0095526 A1 | | 4/2010 | Derrien et al. | |
| 2012/0177489 A1 | * | 7/2012 | Batt | F01D 9/041 415/202 |

OTHER PUBLICATIONS

International Search Report dated Jun. 28, 2013 in PCT/FR13/050891 Filed Apr. 22, 2013.

* cited by examiner

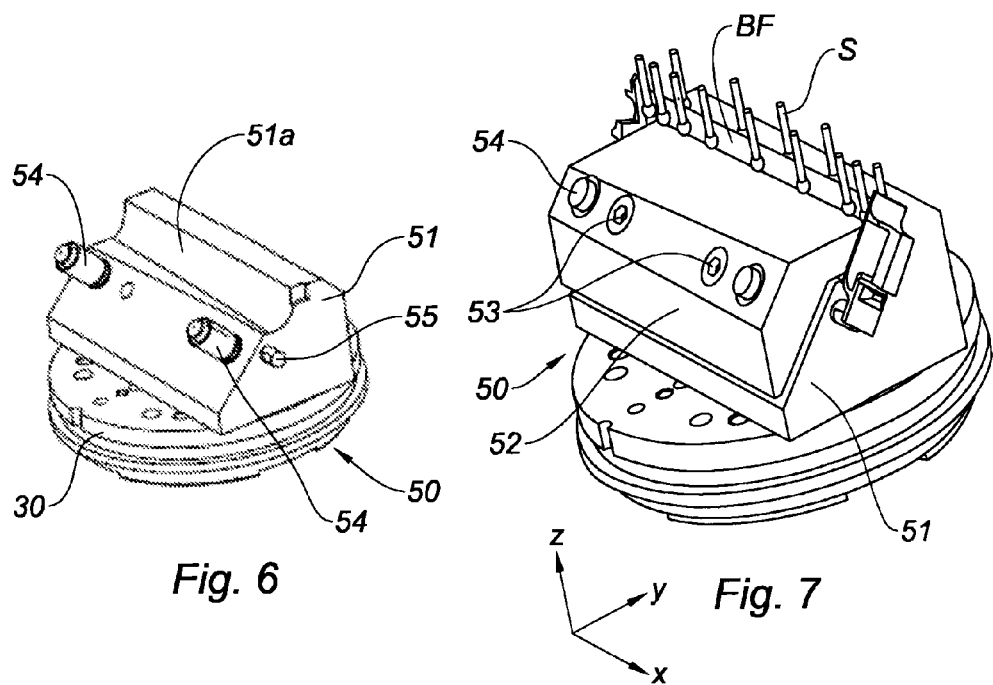
Fig. 6
Fig. 7
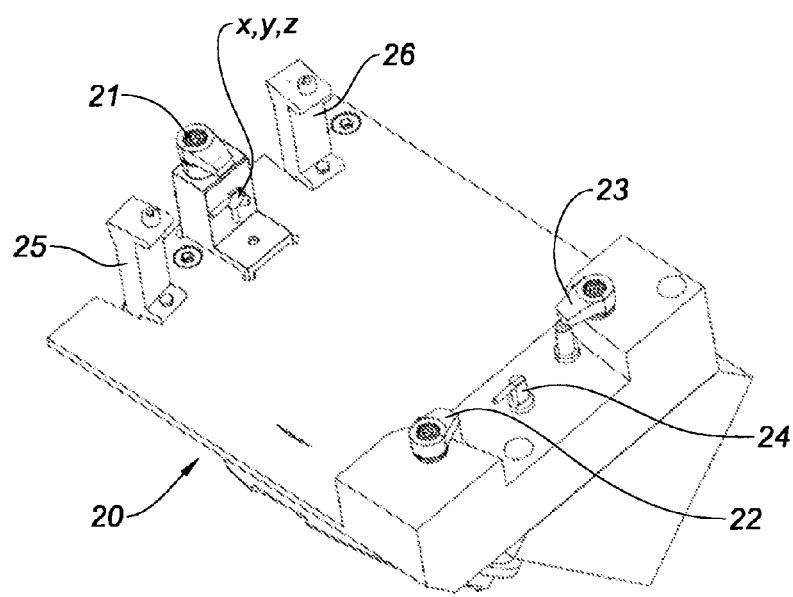
Fig. 8

METHOD FOR MACHINING THE TRAILING EDGE OF A TURBINE ENGINE BLADE

TECHNICAL FIELD

The present invention concerns the manufacture of turbine engine blades and more particularly the field of the final machining of such parts, for example produced by smelting.

Summary of the Problem

Improving the performances of gas turbine engines is achieved through producing bladings to an optimised aerodynamic profile. In particular it is sought to obtain blades comprising a trailing edge, BF, having a thickness that is as small as possible in view of mechanical-strength and manufacturing constraints. Thus, in the aeronautical field, for a two-spool gas turbine engine, such as a multi-flow turbojet engine, one objective is the manufacture of rotor blades for the stages of the low-pressure turbine, where the thickness of the trailing edge is as low as 0.2 mm. For blades forming the distributers of the low-pressure stages, the thickness sought is 0.5 mm.

The bladings mentioned above are generally manufactured by smelting and casting metal in a mould according to the so-called lost wax technique, which makes it possible to directly obtain the required shape of the vane without passing through the implementation of machining steps for arriving at the finished part.

However, the smelting methods of the current prior art do not make it possible to obtain bladings having such fine trailing edges. By smelting, at best bladings having a trailing-edge thickness of around 0.7 mm are obtained when using nickel- or cobalt-based alloys.

Thus, faced with the requirements for improving the aerodynamic performance of turbine engines, smelting techniques have reached their limits with regard to the fineness of the trailing edges. Supplementary machining is necessary.

However, a simple machining of the trailing edge so as to reduce the thickness thereof would not make it possible to achieve the required fineness since the blank parts resulting from smelting—as revealed by contactless measurements of the thicknesses—exhibit deformations along the trailing edge of the vane. An examination of these deformations reveals that they have a shape comparable to that which would result from buckling of the vane.

Starting from these findings, the applicant set the objective of developing a method for manufacturing turbine engine bladings where the fineness of the trailing edge satisfies current requirements for improving their aerodynamic performances.

SUMMARY OF THE INVENTION

The present invention achieves this objective by means of a method for manufacturing a turbine engine blade, the blade comprising a vane and the profile of the vane having a theoretical digital model, involving the manufacture of a blank having a machining allowance along the trailing edge of the vane with respect to the theoretical profile,
characterised by the fact that said machining allowance is removed by adaptive machining, comprising the steps of:
positioning the blank in a reference frame,
acquiring, by probing at a given number of points on a first face of the blank, along the trailing edge, the position of said points in the reference frame,
determining the differences in position, in one direction, from corresponding points on the theoretical model,
producing machining grids on said first face of the blank, the apexes of the grids being determined from said points probed,
determining the quantity of material to be removed on the surface of the grids, this depending on the position of the points on the grid with respect to the apexes of the grids and said position differences, and machining thereof.

The method of the invention makes it possible to perform the finishing operations on a numerically controlled machine tool providing great precision of the machining and a profile meeting the aerodynamic constraints. In particular no projection appears on the treated face between the machined surface portion and the adjacent surface. The machining is said to be adaptive since the path of the machine tool adapts to the geometry of the part during machining.

In accordance with another feature, the machining allowance to be machined is provided on the suction face, on the pressure face and/or on the chord. In particular a first machining allowance is eliminated on the suction face, which constitutes the first face. When the machining allowance extends over both faces, the fact that the degree of deformation of the vane on the pressure face is similar to that on the suction face but in the opposite direction is extrapolated. In this way the correction measured at each point on the first face is used to determine the correction to be machined on the opposite face. This correction is equal in value and opposite in direction.

Finally, where applicable, the chord of the blade is reduced along the trailing edge in order to arrive at the profile of the trailing edge having the required thickness.

The number of points probed is at least three. Said points are distributed between the two platforms for a nozzle sector or between the platform of the root and apex of the vane for a rotor blade. They are arranged parallel to the trailing edge. In particular the apexes of the machining grids comprise the probed points and points the position of which is derived by translation along the chord passing through the probed points.

The machining is preferably effected by slab milling, that is to say the material is removed by the cutting peripheral wall of a cylindrical tool rather than by the distal end thereof.

Other machining means fall within the scope of the method of the invention. For example, it may be an adaptive belt polishing by means of a polishing machine or polishing robot. It may be an adaptive machining by grinding or planing. It may also be machining by milling robot rather than by machine tool. More generally the invention covers any adaptive material-removal method and tool.

In accordance with another feature and according to an advantageous embodiment, the method comprises the mounting of the blading on a removable support and the mounting of the removable support on a numerically controlled machine tool having a machining axis system, the machining being effected with removal of material along one component of the three axes of the machining axis system.

More particularly, according to a first application, the blading being a turbine rotor blade, the blading is fixed on the removable support while being gripped between a removable jaw and a fixed jaw so as to form a rigid assembly. The fixed jaw is shaped to the theoretical profile of a face of the vane, preferably its suction face, while leaving free the trailing edge to be machined. The part is gripped over the largest surface area possible in order to reduce vibrations while maintaining accessibility firstly for the probe for the measurements and then secondly for the tools for the machining.

According to a second application, the blading forming part of a turbine nozzle sector, the removable support is arranged for isostatic mounting of the sector in the removable support. The mounting is isostatic since it locks the six degrees of freedom of the part (3 translations and 3 rotations). It repeats support points identical to those used for the inspection operation after machining. In accordance with another feature, the removable support comprises a means for damping the vibrations produced during machining.

According to this second application, the machining of each of the blades in the nozzle sector comprises a prior step of best adjusting the blade with respect to the machining axis system on the machine tool.

The present invention also relates to the removable support for implementing the method, the blading being a turbine rotor blade.

The machining support of a turbine engine rotor blade comprising a base arranged for fixing the support to the platform of a numerically controlled machine tool and a means for fixing the blade on the base is characterised by the fact that the fixing means comprises a fixed jaw rigidly connected to the base and a free jaw, the fixed jaw having a support surface able to receive the vane of said blade and which corresponds to the theoretical profile of said vane.

The support has in particular the following features, taken alone or in combination:
- The machined surfaces of the trailing edge are preferably parallel to the axis of the machining tool such as a broach. In the case of a five-axis numerically controlled machine, this makes it possible to avoid errors in positioning of the rotation axes (that is to say the $4^{th}$ and $5^{th}$ axes) of the machine.
- The support is formed so as to provide a free machining zone along the trailing edge of the vane.
- The support is formed so as to provide a free machining zone along and on either side of the trailing edge of the vane.
- The support comprises means for translational guidance of the free jaw.
- The support comprises means for clamping the free jaw on the fixed jaw with the interposing of a vane, able to straighten the vane of the blade, when the latter comprises deformations such as buckling.
- The support has a stop parallel to the axis of the theoretical profile of the vane, able to receive in abutment the root platform of the blade.

The present invention also relates to the support of a turbine engine nozzle sector.

The machining support of a turbine engine nozzle sector obtained by casting metal comprising a plurality of vanes rigidly connected at one end to an internal platform and at the other end to an external platform, comprising a base having a flat face arranged for fixing the support to the platform of a numerically controlled machine tool and a means for fixing the nozzle sector to the base, is characterised by the fact that the fixing means is arranged so that the zones of the trailing edges of the vanes that are to be machined are oriented perpendicular to said flat face.

The support has in particular the following features taken alone or in combination:
- The fixing means comprises a support for the internal platform on the base and a support for the external platform on the base.
- The fixing means comprises a flange for immobilising the external platform on its support, on the three principal axes of the nozzle sector.
- The fixing means comprises flanges for immobilising the internal platform in abutment on the base, being rotationally immobilised about the three principal axes of the nozzle sector.
- The support comprises means for damping vibrations.
- The vibration-damping means comprise at least one clevis rigidly connected to the base and having support surfaces against the two opposite faces of a platform, in particular the external platform.
- The support comprises two clevises for damping the vibrations, one on each side of the flange fixing the platform.

The present invention also relates to a device for implementing the method described above, comprising:
- means for positioning the blank in a reference frame,
- means for acquiring, by probing at a given number of points (Ni) on a first face of the blank, along the trailing edge, the position of said points in the reference frame,
- means for determining the position differences delta (Ni) in one direction from the corresponding points of the theoretical model,
- means for producing machining grids on said face of the blank, the apexes of the grids being determined from said points (Ni),
- means for determining the quantity of material to be removed on the surface of the grids, this depending on the position of the points (Nc) on the grid with respect to the apexes of the grids and said position differences, and
- means for machining the vane,
- characterised in that the positioning means comprise a removable support comprising a base for fixing to the platform of the machine tool and either a jaw rigidly connected to the base to the theoretical profile of a face of the vane of a turbine rotor blade to be machined, or a means for the isostatic fixing of a nozzle sector to be machined on the base.

BRIEF DESCRIPTION OF THE FIGURES

The invention will be better understood and other aims, details, features and advantages thereof will emerge more clearly in the detailed explanatory description that follows of an embodiment of the invention given by way of purely illustrative and non-limitative example, with reference to the accompanying schematic drawings, in which:

FIG. 6 is a support for an isolated rotor blade;
FIG. 7 is the support of FIG. 6 with a blade between the jaws as well as the rod and bead of the probe at various probing positions;
FIG. 8 is the support for a turbine nozzle sector.

DETAILED DESCRIPTION OF THE INVENTION

Figures 1, 2:
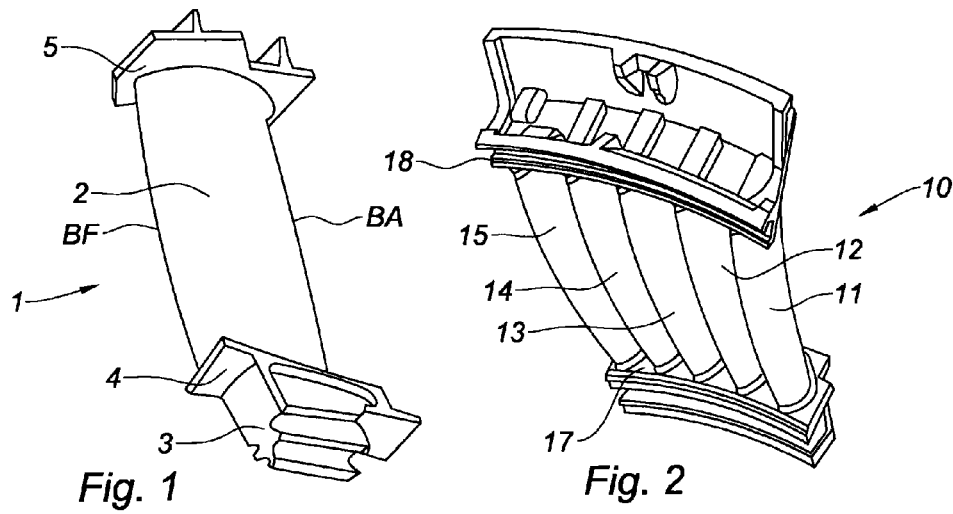
FIG. 1 is a turbine blade.
FIG. 2 is a turbine nozzle sector.

FIG. 1 shows a low-pressure turbine blade 1 seen from the side of the suction face thereof. This is a rotor blade, and is individual and comprises a root 3 by means of which it is mounted on a turbine rotor, and a platform 4 between the root 3 and the vane 2. A second platform 5 is formed at the apex of the blade 1. The vane 2 extends, between the two platforms, also along its chord between the leading edge BA and the thinner trailing edge BF. The rotation axis of the turbine rotor on which the blade is mounted is parallel to the axis of the blade root.

FIG. 2 is a low-pressure turbine nozzle sector 10, in a single piece, obtained by metal casting. This sector comprises a plurality of vanes 11 to 15 arranged radiating in a sector of a disc between an internal platform 17 and an external platform 18, both in an arc of a circle. Such a low-pressure nozzle sector 10, like the low-pressure rotor blades, is manufactured according to the lost wax casting technique known per se. Despite the precision obtained, this technique does not make it possible to achieve the low thicknesses required at the trailing edges. Machining is therefore necessary. The invention provides a method for achieving such a finish, taking account of the deformations of the vane.

Figure 3:
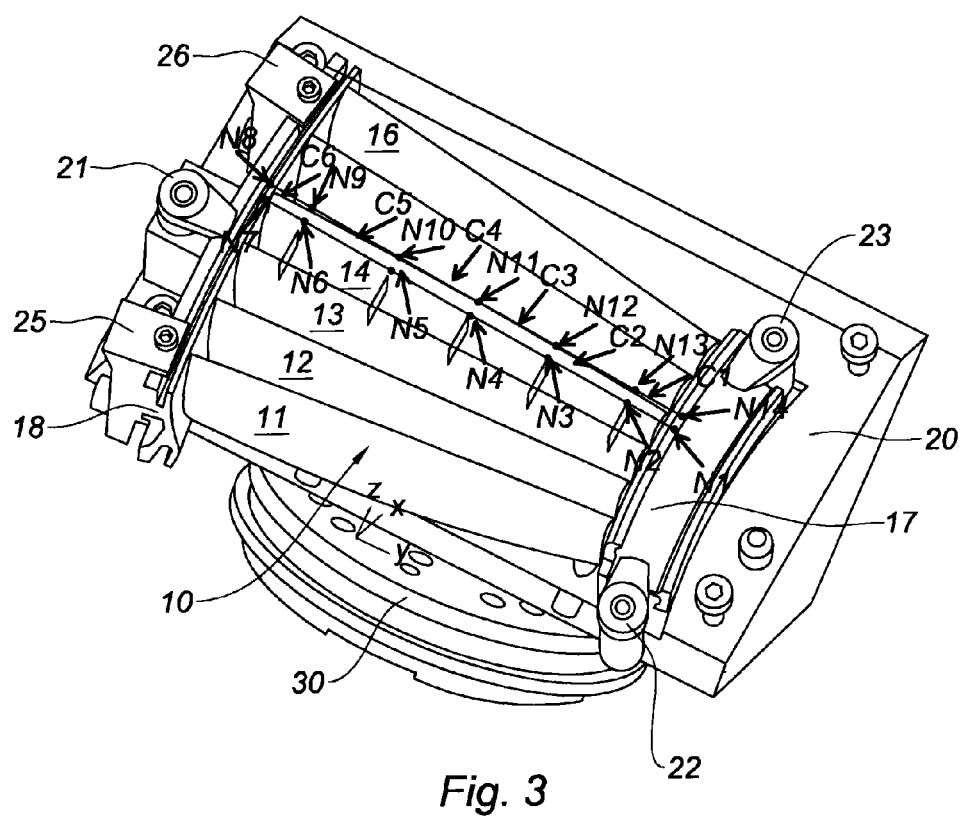
FIG. 3 is nozzle sector mounted on a removable support, the points constituting the machining grids defining the adaptive correction zone on the trailing edge being identified.

The method applied to the finishing of the vanes 11 to 16 of a six-vane single-piece nozzle sector 10 is described. Said sector is first of all mounted on a removable support 20 as can be seen in FIG. 3. This is an isostatic mounting along the three axes of a rectangular axis system, in particular the reference axis system of the sector, involving holding in translation along the three axes of the reference axis system, by means of the flange 21 arranged on the side of the external platform 18 at the centre thereof and which provides the fixing along the three directions of the axis system, and three supports for rotational locking by means of the flanges 22, 23 at the ends of the internal platform 17 and the support 24 at the centre (not visible in FIG. 3). The mounting further comprises two clevises 25 and 26 for damping vibrations, arranged on either side of the flange 21.

The angle of the plane of the sector is chosen so as to take into account that of the plane of the zone of the trailing edge with respect to the same plane. It is preferable for the machined surfaces of the trailing edge to be parallel to the axis of the machining tool such as a broach. In the case of a five-axis numerically controlled machine for example, this makes it possible to avoid errors in positioning of the rotary axes (that is to say the $4^{th}$ and $5^{th}$ axes) of the machine.

The support 20 is itself mounted on the platform 30 of the numerically controlled machine (not shown) by means of a pedestal 31.

Once the support 20 is mounted on the platform of the machine tool, the axis machining system is best fixed with respect to the vane to be machined. For this purpose, the position of a certain number of points on the vane is acquired, by probing by means of a suitable apparatus, and suitable software, for example using the least squares method, computes the corrections to be made to the reference axis system of the mounting on the machining machine. This correction is made by means of three rotations about the X, Y and Z axes and a translation of the origin in the X, Y and Z directions (the linear axes of the machine).

The machining axis system coincides with the principal axes of the vane, 11 to 16 respectively, to be machined. The definition of the axis system is linked to the configuration of the machine as well as to the possibility of probing along three axes (the rotation axes being deactivated). The positioning of the machined zone of the vane parallel to the axis of the broach means that the X axis is the radial axis of the vane with respect to the driving axis, the Z axis the rotation axis of the platform, perpendicular to the plane of the platform, the Y axis completing the direct axis system. The plane XY consists of the support face of the platform. It should be noted that the fixing of the machining axis system must be done for each of the vanes of the nozzle sector.

Once the fixing is effected, the so-called adaptive machining of the trailing edge BF is carried out. This machining technique is described in the patent application FR 11 55 424 submitted by the present applicant.

Said machining technique comprises the acquisition, by probing by means of a suitable probing apparatus with or without contact, of the position of a certain number of points along the trailing edge BF of the vane to be machined. These points are those defined on the 3D theoretical model of the vane in the CADM software. The reference frame is that of the machining axis system.

Here, the position is measured of the points N2 to N6 (FIG. 3) distributed between the internal platform 17 and the external platform 18 at one mm (one mm corresponds to a functional dimensioning on the reference plane for measuring the thickness of the trailing edge) and along the trailing edge BF of the blank vane 14 to be machined. The number of points is preferably at least three.

From these points, the position of which has been measured, a plurality of induced points are defined. All the tool/part contact points defining the machining of the pressure face and suction face must be contained in grids, and therefore the point N1 and the point N7 and then the points N8 to N14 are added. Said points N8 to N 14 are at the intersection of the chord passing through the probed points and the trailing edge. The points N1 and N7 that are too close to the platform to be able to be probed are obtained by translation of the adjacent points N2 and N6. The points N1 to N14 thus delimit the machining grid apexes, C1 to C6.

For each of the points N1 to N14, the value of the differences delta (N) between the measured or induced position and the position of the theoretical model is computed. Because of the fixing of the reference axes, this difference is measured along the principal axis X. For each machining grid and at each contact zone of the tool with the surface of the blade inside the grids, the quantity of material to be removed is defined firstly by the position of the contact of the tool in the grid and the value of the differences delta (N) measured on each apex of the grid concerned.

Figures 4, 5:
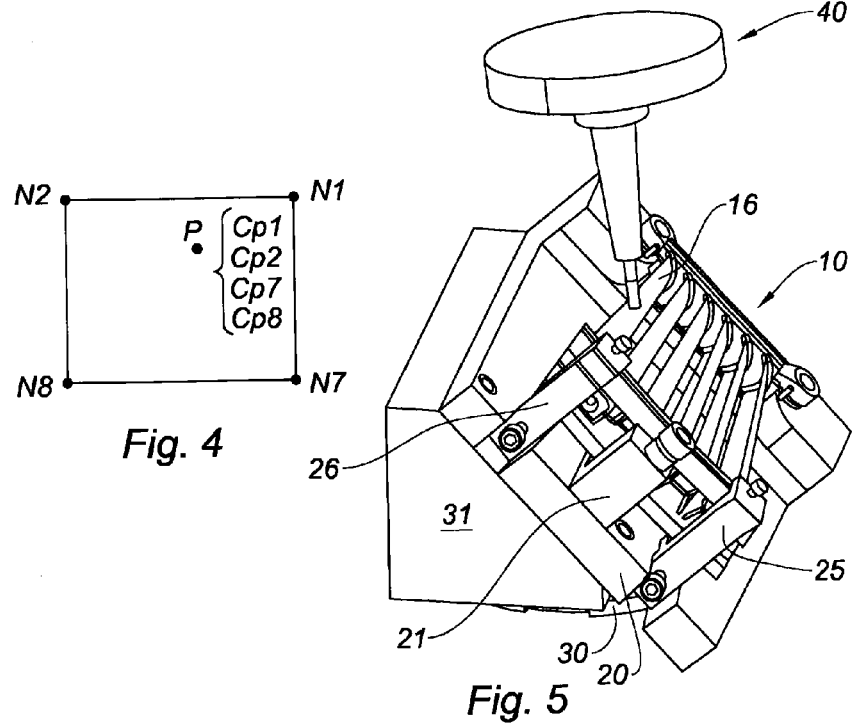
FIG. 4 illustrates how the calculation of the position of the machining tool is determined.
FIG. 5 is the machining tool in action along the trailing edge of a vane.

The method for determining a quantity of material to be removed by machining is described more precisely with reference to the example in FIG. 4. In this example, the grids are polygons with four sides; they could however have a different number of sides.

Each point P is defined with respect to the apexes or nodes of the grid in which it is situated by means of four coefficients, referred to as weighting coefficients $CP_i$ (i being the reference number of the node in question). Each weighting coefficient corresponds to the weight that it is necessary to allocate to the corresponding node so that the point P is the centre of mass of these four nodes. In other words, the closer the point P is to a node, the higher the coefficient allocated to this node, and conversely the nodes furthest away are allocated a small coefficient. In order to make the definition of these weighting coefficients unique, they are reduced proportionally to one another so that the sum thereof is equal to one. By way of example, if the point P is at the centre of the grid, the four coefficients are equal to 0.25; if it is close to one of the nodes, as can be seen in FIG. 4, the coefficient CP1 will be equal to 0.5 whereas the other three will be equal respectively to 0.35 for CP2, 0.10 for CP7 and 0.05 for CP8.

The file formed by the weightings of the points P to be scanned by the machining tool and by the corresponding orientations of the axis of the tool is then converted into a format that can be understood by the numerically controlled machine and loaded into the software thereof.

The following step consists of defining a delta positioning difference for all the contact points between the part and the tool during the final machining. For this purpose the computing of this delta takes into account the weighting coefficients of the point P computed previously and the differences delta (Ni) from the nodes of the grid in which the point P is situated. The delta at point P, that is to say the correction to be made to the point P on the surface of the vane, is defined as being equal to the sum of the values obtained by multiplying each delta of a node by the weighting coefficient that is associated therewith.

In the example of the point P situated in the grid formed by the four nodes N1, N2, N7 and N8, the value of delta (P) is equal to CP1*delta (N1)+CP2*delta (N2)+CP7*delta (N7)+CP8*delta (N8).

More generally, it can be expressed by the formula delta (P)=ΣCPi*delta (Ni), where i corresponds to the index of the apexes of the machining grids.

This difference delta (P), which extends along the X-axis of the machining axis system at point P, determines the component of the correction to be applied to the Cartesian coordinates given to the program that controls the positioning of the tool during the final machining. In the present case, the correction is made only along the X axis.

The machining is preferably done by a five-axis numerically controlled machine tool for which the position of the tool is continually corrected by the value issuing from the deltas of the nodes of the grid in question and the weighting coefficients of the point where said tool is situated. Preferably the machining is done by slab milling; that is to say by the cutting peripheral wall of the milling cutter.

Once the first face has been machined to bring its position to that of the surface of the theoretical model, the machining correction is determined on the face opposite to the first, that is to say here the pressure face. As on the suction face, the starting point is the initial points N2 to N6. Since the probe cannot access between the vanes, the correction is made in the same way as corrections carried out on the suction face. The same grids as on the suction face are used, and only the tool/part contact points are different.

One example of the performance of the operations of milling the vanes of a nozzle sector is as follows:
  rough milling of the chord of each vane, one blade after another, this milling aiming to keep a machining allowance,
  rough milling of the pressure face of each vane, one vane after another,
  semi-final and final milling of the suction face of each vane, one vane after another,
  final milling of the pressure face of each vane, one vane after another,
  final milling of the chord of each vane, one vane after another.

The thickness removed during the rough machining is around a few tenths of a millimeter, or even a few millimeters (depending on the machining allowance of the smelting).

The thickness removed during the final machining is around a few hundredths of a millimeter.

The amount of the correction is a few tenths of a millimeter.

FIG. 5 shows the position of a milling cutter 40 machining the suction face of the vane 16, running along the trailing edge. The tool is mounted on a tool holder able to move along five axes for example.

FIGS. 6 and 7 show the mounting of a rotor blade on a support 50. The support comprises a fixed jaw 51, the surface 51a of which contacting the rotor blade is formed so as to receive the suction face of the rotor vane. FIG. 6 shows the fixed jaw 51 alone. Said jaw is fixed to the platform 30 and has a specified inclination. This inclination is chosen so as to allow orientation of the machining tool in a direction such as the direction of the axis parallel to the axis of the broach. FIG. 7 shows the rotor blade held between the jaw 51 and a removable jaw 52 so as to leave free the region of the trailing edge of the vane.

The various positions of the probe S where its sphere is in contact with the surface of the zone of the trailing edge are also shown. The mounting enables the probe to be positioned at each of the points, the position of which it is wished to measure.

This arrangement enables the tool to machine by running on the two faces, pressure and suction, of the vane as well as the chord. The two jaws are gripped by the screws 53. The clamping movement of the movable jaw against the fixed jaw is ensured by guidance along guide pins 54. The screws allow sufficient clamping to reduce the deformation of the vane.

The fixed jaw 51 comprises a stop 55 for the blade root platform making it possible to fix the blade in an axial position.

The machining is carried out in the same way as described above for a nozzle sector vane.

FIG. 8 shows the support 20 for a nozzle sector without the part. The isostatic fixing elements having the attachment flange 21 on one side for immobilising in the three directions can be seen. On the other side the three supports for rotational immobilisation about the three axes can be seen.

The clevises 25 and 26 for damping the vibrations are arranged on either side of the flange 21. Said clevises are fixed by screws to the base and comprise support pads bearing against the faces of the platform, preventing the platform from vibrating.

The invention claimed is:

1. A method for manufacturing a turbine engine blade, the blade including a vane, an inner platform, and an outer platform, a profile of the vane being defined by a theoretical digital model, comprising:
  manufacturing of a blank of the blade, the blank including the vane, the inner platform, and the outer platform, and having a machining allowance along a trailing edge of the vane with respect to the theoretical profile, and
  removing the machining allowance by adaptive machining, comprising:
  a) positioning the blank in a machining tool such that a rectangular axis system defining a reference frame of the blank coincides with a machining axis system of the machining tool;
  b) acquiring, by probing at a given number of points on a first face of the blank, along the trailing edge, a position of the points in the reference frame;
  c) determining differences in position, in one direction, from corresponding points on the theoretical model;
  d) producing machining grids on the first face of the blank, apexes of the grids being determined from the points;
  e) determining a quantity of material to be removed on a surface of the grids, depending on a position of the points on the grid with respect to the apexes of the grids and the position differences; and f) machining the vane using the machining tool, wherein the positioning includes mounting the blank in a support, the support including a first fixing mechanism which fixes the inner platform and a second fixing mechanism which fixes the outer platform, wherein the movement of the machining tool is along a principal direction in the machining axis system which is parallel to a radial axis of the vane, and wherein the determining the quantity of material to be removed on the surface of the grids is measured along the principal direction in the machining axis system, and for each machining grid and at each contact zone of the machining tool with a surface of the blade inside the grids, the quantity of material to be removed is defined by a position of contact of the machining tool in the each machining grid and a value of the position differences measured on each apex of the each machining grid using weighting coefficients for each apex of the each machining grid, a value of a respective weighting coefficient corresponding to a distance between a center of mass of the each machining grid and the respective apex, a sum of the weighting coefficients for the each machining grid being equal to 1.

2. A method according to claim 1, wherein the machining allowance to be machined is formed on a suction face and on a pressure face of the vane.

3. A method according to claim 2, wherein the machining allowance is further formed on a chord of the vane.

4. A method according to claim 1, wherein the points probed are at least three in number.

5. A method according to claim 4, wherein the points probed are arranged parallel to the trailing edge.

6. A method according to claim 1, wherein the apexes of the machining grids comprise the probed points and points that are deduced by translation along a chord passing through the probed points.

7. A method according to claim 1, further comprising machining the face opposite to the first face, the quantity of material removed being determined by the position with respect to the apexes of the machining grids of the first face.

8. A method according to claim 1, wherein the support is removable and the support is mounted on the machining tool which is a numerically controlled machine tool.

9. A method according to claim 8, wherein the blade is a rotor turbine blade which is fixed to the removable support by being gripped between a removable jaw and a fixed jaw, the fixed jaw being shaped to the theoretical profile of a face of the vane, leaving free the trailing edge to be machined.

10. A method according to claim 8, wherein the blade forms part of a turbine nozzle sector, the removable support is arranged for isostatic mounting of the turbine nozzle sector in the removable support.

11. A method according to claim 10, wherein the removable support comprises support pads for damping vibrations during machining.

12. A method according to claim 10, wherein the machining of each of the blades of the nozzle sector comprises a prior best readjusting the blade with respect to the machining axis system on the machine tool.

13. A method according to claim 1, wherein the differences in position are determined along the direction in the machining axis system which is parallel to the radial axis of the vane.

14. A method according to claim 1, wherein the machining grids are polygons with four sides.

* * * * *